(12) United States Patent
Hu

(10) Patent No.: US 11,876,291 B2
(45) Date of Patent: Jan. 16, 2024

(54) MILLIMETER-WAVE ANTENNA MODULE PACKAGE STRUCTURE AND MANUFACTURING METHOD THEREOF

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 17/980,536

(22) Filed: Nov. 3, 2022

(65) Prior Publication Data
US 2023/0140354 A1  May 4, 2023

Related U.S. Application Data

(60) Provisional application No. 63/275,914, filed on Nov. 4, 2021.

(30) Foreign Application Priority Data

Oct. 31, 2022  (TW) .................. 111141455

(51) Int. Cl.
 *H01Q 1/22* (2006.01)
 *H01Q 1/50* (2006.01)
(52) U.S. Cl.
 CPC ............. *H01Q 1/50* (2013.01); *H01Q 1/2283* (2013.01)

(58) Field of Classification Search
 CPC .......... H01Q 1/38; H01Q 1/50; H01Q 1/2283; H01L 23/66
 See application file for complete search history.

(56) References Cited

U.S. PATENT DOCUMENTS

| 10,985,451 B2* | 4/2021 | Kim .................... H01L 23/5386 |
| 2014/0140031 A1* | 5/2014 | Fujita ................ H01L 23/49816 361/803 |
| 2023/0012815 A1* | 1/2023 | Reichman ................ H01Q 9/16 |

* cited by examiner

*Primary Examiner* — Hasan Islam
(74) *Attorney, Agent, or Firm* — JCIPRNET

(57) ABSTRACT

A millimeter wave antenna module package structure includes a first group of circuit structure, a second group of circuit structure, and a plurality of joints. The first group of circuit structure includes at least one first circuit layer and a plurality of first conductive connectors, and the at least one first circuit layer includes an antenna pattern. The second group of circuit structure includes a plurality of second circuit layers and a plurality of second conductive connectors. The joints are disposed between the first group of circuit structure and the second group of circuit structure. The joints are connected to the first conductive connectors and the second conductive connectors, such that the first group of circuit structure is electrically connected to the second group of circuit structure to form a multi-layer redistribution structure. A manufacturing method of the millimeter wave antenna module package structure is also provided.

8 Claims, 17 Drawing Sheets

MILLIMETER-WAVE ANTENNA MODULE PACKAGE STRUCTURE AND MANUFACTURING METHOD THEREOF

CROSS-REFERENCE TO RELATED APPLICATION

This application claims the priority benefits of U.S. provisional application Ser. No. 63/275,914, filed on Nov. 4, 2021 and Taiwanese application serial 111141455, filed on Oct. 31, 2022. The entirety of each of the above-mentioned patent applications is hereby incorporated by reference herein and made a part of this specification.

BACKGROUND

Technical Field

The disclosure relates to a millimeter-wave antenna module package structure and a manufacturing method thereof.

Description of Related Art

During packaging of a high-frequency antenna, a distance between a transmitting end and a receiving end thereof and a radio frequency integrated circuit (RFIC) is required to be optimized, and a surface roughness of a transmission copper wire thereof is also required to be relatively smooth. The distance between the antenna and the integrated circuit (IC) cannot be precisely controlled if a conventional PC (polycarbonate) board (circuit board) process is used. In addition, during an etching process of manufacturing the PC board, the surface of the transmission copper wire may be roughened. These may reduce an efficiency of a high-frequency antenna.

SUMMARY

The disclosure provides a millimeter-wave antenna module package structure and a manufacturing method thereof, in which a relatively high efficiency of a high-frequency antenna can be achieved while a multi-layer redistribution structure is provided.

In an embodiment of the disclosure, a millimeter wave module antenna package structure includes a first group of circuit structure, a second group of circuit structure, and a plurality of joints. The first group of circuit structure includes at least one first circuit layer and a plurality of first conductive connectors. The at least one first circuit layer includes an antenna pattern. The second group of circuit structure includes a plurality of second circuit layers and a plurality of second conductive connectors. The plurality of joints are disposed between the first group of circuit structure and the second group of circuit structure. The joints connect the first conductive connectors and the second conductive connectors to electrically connect the first group of circuit structure to the second group of circuit structure to form a multi-layer redistribution structure.

In an embodiment of the disclosure, each of the at least one first circuit layer includes a plurality of first conductive vias, and each of the second circuit layers includes a plurality of second conductive vias. A direction in which the first conductive vias taper is opposite to a direction in which the second conductive vias taper.

In an embodiment of the disclosure, the millimeter-wave antenna module package structure further includes an underfill. The underfill fills at least part of a gap between the joints, the first group of circuit structure, and the second group of circuit structure. In an embodiment of the disclosure, part of the gap is not filled by the underfill, such that a cavity surrounded by the underfill is formed between the first group of circuit structure and the second group of circuit structure.

In an embodiment of the disclosure, the joints are located in the cavity and separated from the underfill.

In an embodiment of the disclosure, the gap is filled up.

In an embodiment of the disclosure, the millimeter-wave antenna module package structure further includes a first semiconductor device. The first semiconductor device is disposed on the second group of circuit structure and electrically connected to the second group of circuit structure.

In an embodiment of the disclosure, the first semiconductor device includes a plurality of first semiconductor devices. A part of the first semiconductor devices is disposed on a surface of the second group of circuit structure, and another part of the first semiconductor devices is disposed on another surface of the second group of circuit structure opposite to the surface.

In an embodiment of the disclosure, the millimeter-wave antenna module package structure further includes a second semiconductor device. The second semiconductor device is disposed on the first group of circuit structure and electrically connected to the first group of circuit structure.

In an embodiment of the disclosure, a manufacturing method of a millimeter-wave antenna module package structure includes the following. A first group of circuit structure is formed on a first temporary carrier. The first group of circuit structure includes at least one first circuit layer and a plurality of first conductive connectors. The at least one first circuit layer includes an antenna pattern. A second group of circuit structure is formed on a second temporary carrier. The second group of circuit structure includes a plurality of second circuit layers and a plurality of second conductive connectors. The first group of circuit structure and the second group of circuit structure are joined by a plurality of joints. The joints connect the first conductive connectors and the second conductive connectors to electrically connect the first group of circuit structure to the second group of circuit structure to form a multi-layer redistribution structure.

In an embodiment of the disclosure, a dielectric layer of the first group of circuit structure is formed by a liquid curing process.

In an embodiment of the disclosure, a dielectric layer of the first group of circuit structure is formed by a lamination process.

In an embodiment of the disclosure, a metal circuit of the first group of circuit structure is formed by a thin film process.

Based on the foregoing, in an embodiment of the disclosure, a plurality of groups of circuit structures are first separately and individually manufactured on the temporary carriers, and then the groups of circuit structures are directly joined and assembled into a multi-layer redistribution structure. As such, compared to continuously manufacturing a multi-layer redistribution structure at one single time, warpage may be effectively reduced, and the distance between the antenna and the IC may be controlled more precisely. Accordingly, in the millimeter-wave antenna module package structure in an embodiment of the disclosure, a relatively high efficiency of a high-frequency antenna may be achieved while the multi-layer redistribution structure is provided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
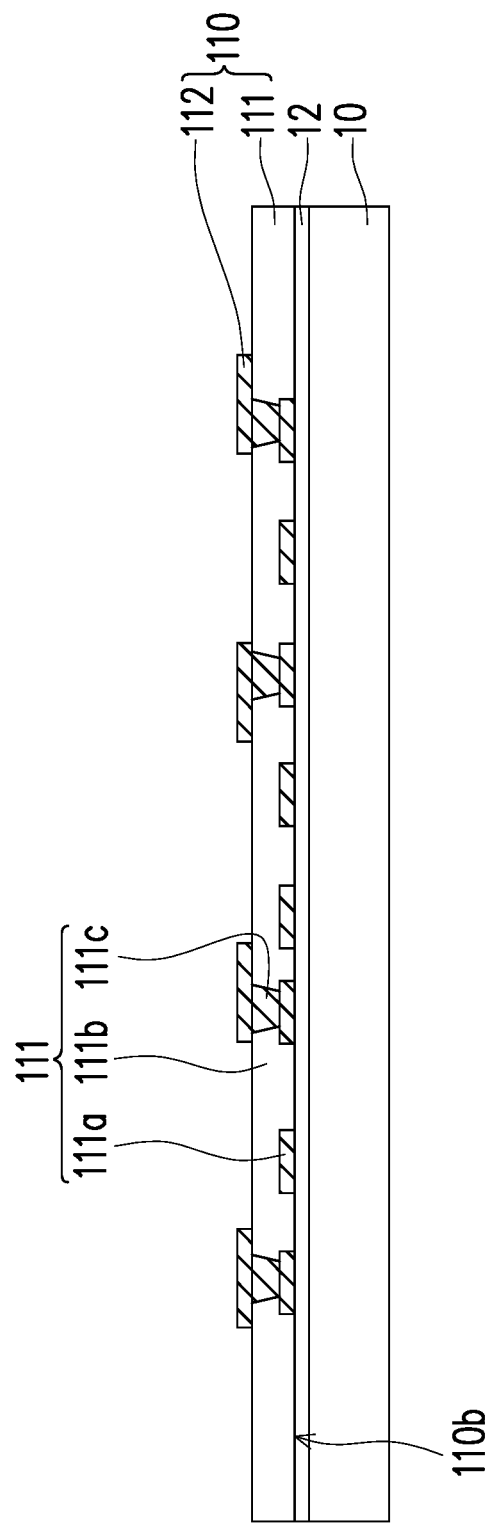
FIG. 1A to FIG. 1C are schematic partial cross-sectional views showing a manufacturing method of a millimeter-wave antenna module package structure according to some embodiments of the disclosure.

Exemplary embodiments of the disclosure will be comprehensively described below with reference to the drawings, but the disclosure may also be embodied in various different forms and should not be construed as being limited to the embodiments described herein. In the drawings, sizes, dimensions, or thicknesses of regions, parts, and layers may not be drawn to scale or may be exaggerated for clarity. For ease of understanding, the same or like elements will be labeled with the same or like reference numerals in the following description, and will not be repeated in the following paragraphs.

Directional terms (e.g., up, down, right, left, front, back, top, bottom) are only used herein for reference to the drawings and are not intended to imply an absolute orientation.

It should be understood that, although terms "first", "second", "third", and so on may be used herein to describe various elements, members, regions, layers, and/or parts, these elements, members, regions, layers, and/or parts should not be limited by these terms. These terms are only used to distinguish one element, member, region, layer, or part from another element, member, region, layer, or part.

Unless otherwise defined, all terms (including technical and scientific terms) used herein have the same meaning as commonly understood by one of ordinary skill in the art related to the disclosure.

Figure 1B:
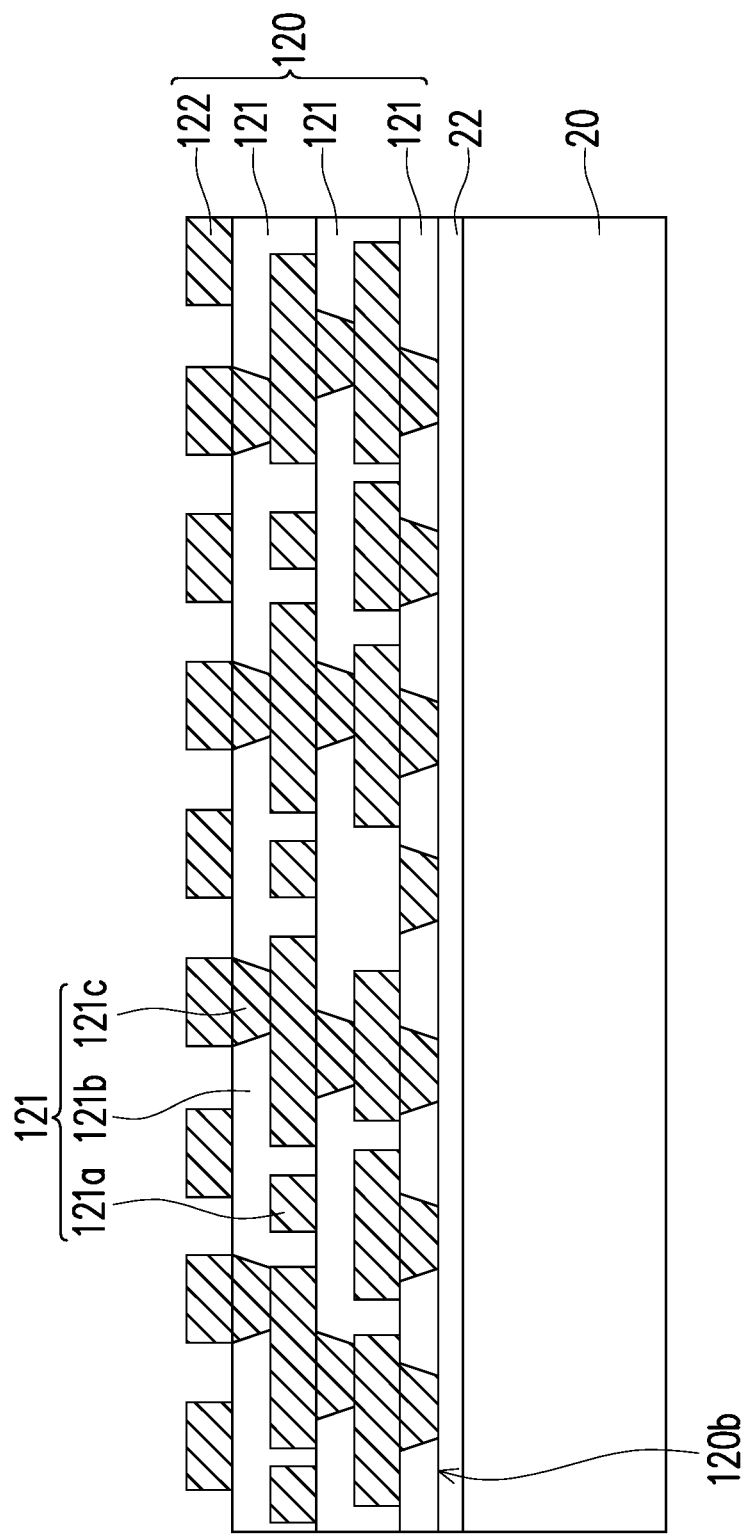
Figure 1C:
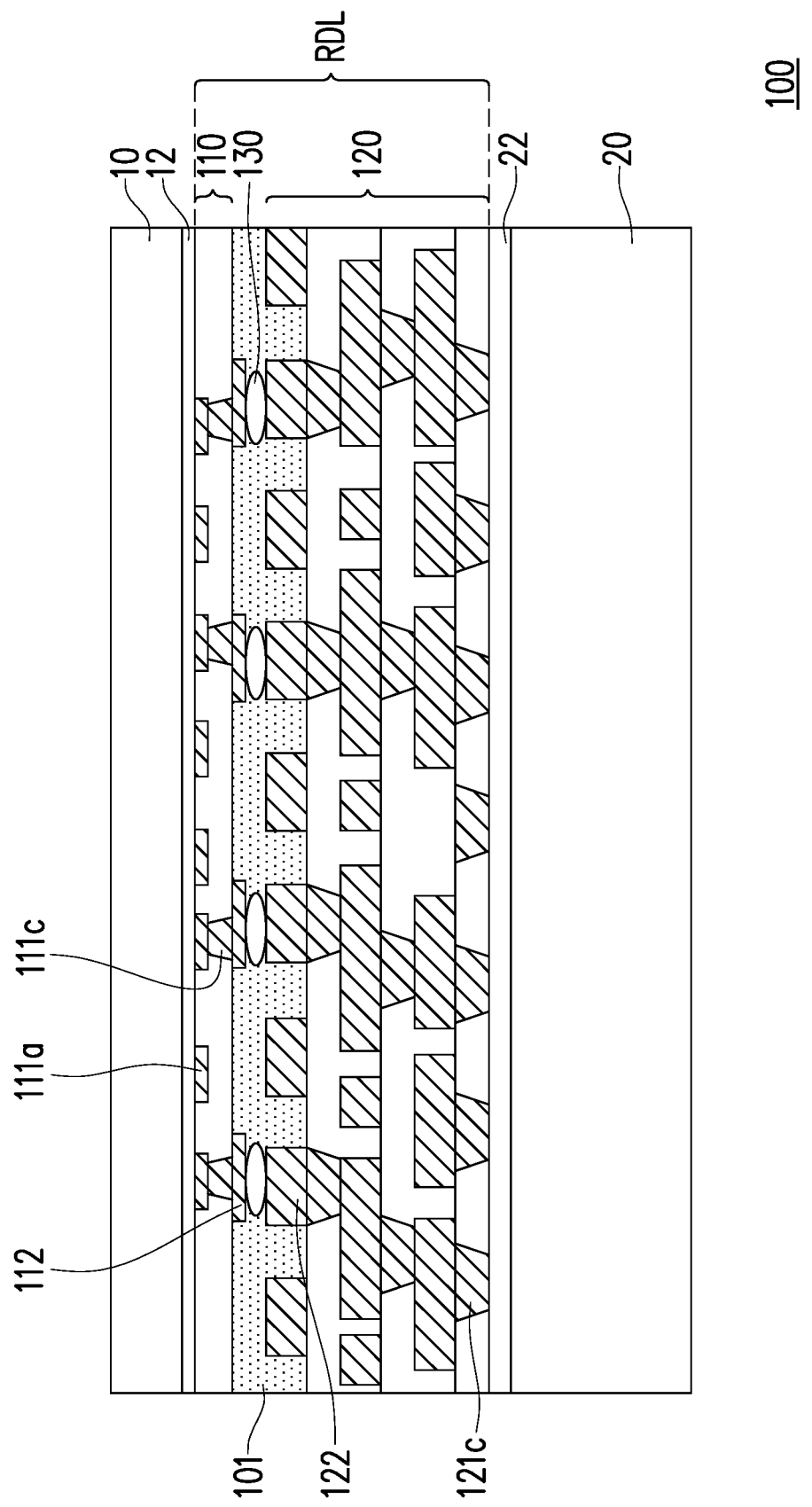
Figure 1D:
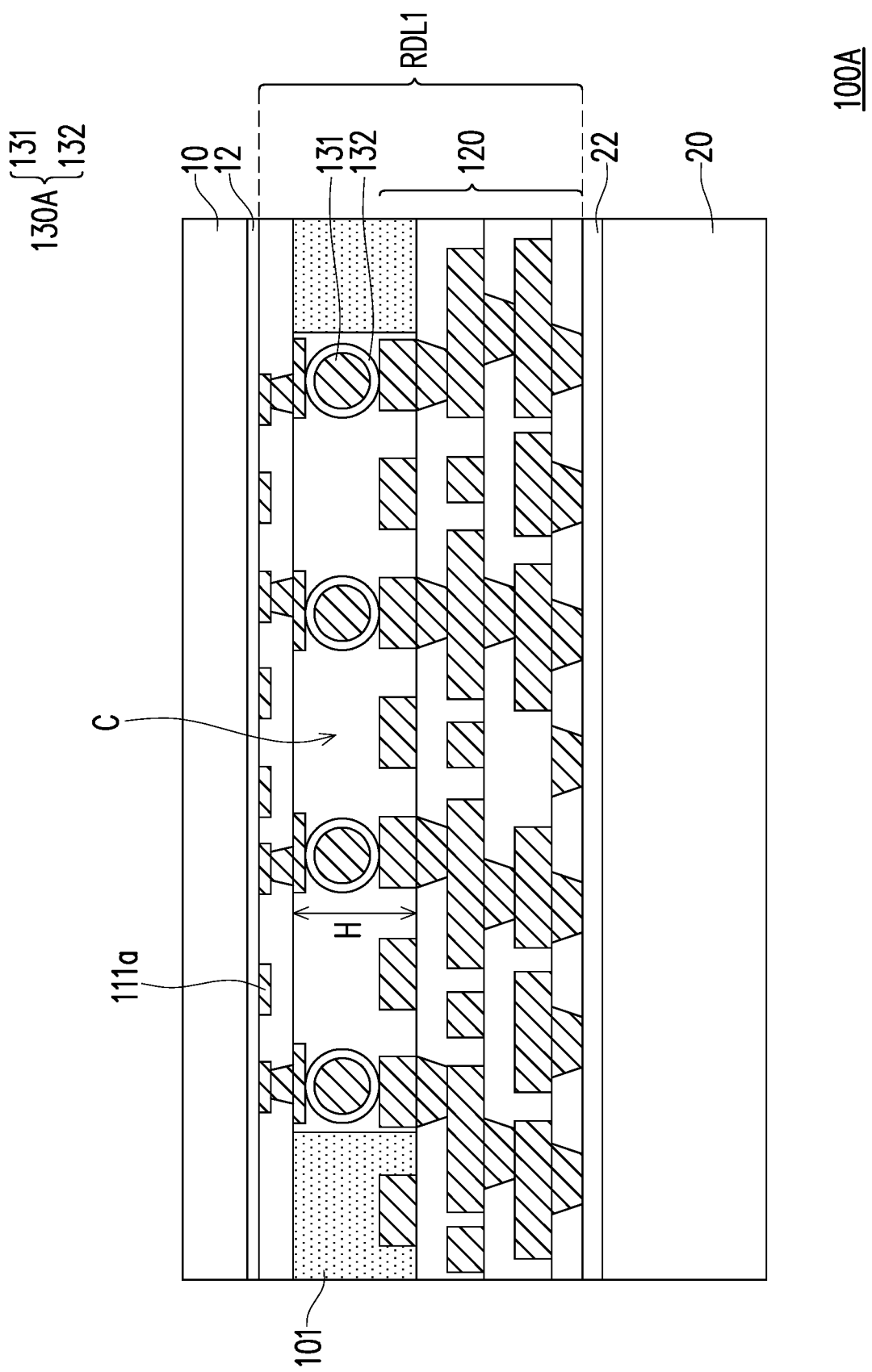
FIG. 1D is a schematic partial cross-sectional view showing an alternative embodiment of FIG. 1C.

FIG. 1A to FIG. 1C are schematic partial cross-sectional views showing a manufacturing method of a millimeter-wave antenna module package structure according to some embodiments of the disclosure. FIG. 1D is a schematic partial cross-sectional view showing an alternative embodiment of FIG. 1C. With reference to FIG. 1A, a first group of circuit structure 110 is formed on a first temporary carrier 10. The first temporary carrier 10 may be made of glass, plastic, silicon, metal, or other suitable materials as long as the material can withstand subsequent processes and in the meanwhile carry structures formed thereon.

In some embodiments, a first release layer 12 (e.g., a light-to-heat conversion film or other suitable release layers) may optionally be coated between the first temporary carrier 10 and the first group of circuit structure 110 to enhance peelability between the first temporary carrier and the first group of circuit structure 110 during subsequent processes and improve flatness of the first group of circuit structure 110, but the disclosure is not limited thereto.

In this embodiment, the first group of circuit structure 110 includes at least one first circuit layer 111 (one first circuit layer schematically shown in FIG. 1A) and a plurality of first conductive connectors 112, and may be formed on the first temporary carrier 10. Each first circuit layer 111 may include an antenna pattern 111a, a first dielectric layer 111b, and/or a first conductive via 111c. Here, the antenna pattern 111a and the first conductive via 111c may be embedded in the first dielectric layer 111b, but the disclosure is not limited thereto.

In some embodiments, the antenna pattern 111a and the first conductive via 111c may be metal circuits of the first group of circuit structure 110, and the metal circuits may be formed by a thin film process. Accordingly, the control of spacing and control of flatness of the copper surface can be effectively improved in an antenna module manufactured by a semiconductor wafer thin film process. As such, the subsequently completed millimeter-wave antenna module package structure may have a thickness and a size less than those made by a PC board process, and is more suitable for the use of mobile communication products, but the disclosure is not limited thereto.

In some embodiments, the first dielectric layer 111b of the first group of circuit structure 110 is formed by a liquid curing process, and a material thereof is polyimide, for example, but the disclosure is not limited thereto. The first dielectric layer 111b of the first group of circuit structure 110 may also be formed by a lamination process, and a material thereof is an Ajinomoto Build-up Film (ABF), for example.

In some embodiments, the antenna pattern 111a may be formed on the first temporary carrier 10. The antenna pattern 111a may be in direct contact with the first release layer 12. Next, the first dielectric layer 111b including a plurality of openings may be formed on the first temporary carrier 10. The openings expose at least a part of the antenna pattern 111a for electrical connection. Then, a conductive material may be formed in the openings of the first dielectric layer 111b to form the first conductive via 111c. Next, the first conductive connector 112 may be formed using a suitable deposition process. It should be noted that the first group of circuit structure 110 as shown in FIG. 1A is only exemplary, and more layers of the first group of circuit structure 110 may be formed depending on the circuit design requirements. Any form the first group of circuit structure 110 that includes the at least one first circuit layer 111 having the antenna pattern 111a and the first conductive connectors 112 shall fall within the scope of the claims following the description.

In some embodiments, the materials of the antenna pattern 111a and the first conductive via 111c may include copper, gold, nickel, aluminum, platinum, tin, a combination thereof, an alloy thereof, or other suitable conductive materials. The material of the first dielectric layer 111b may include polyimide (PI), benzocyclobutene (BCB), polybenzoxazole (PBO), an inorganic dielectric material (e.g., silicon oxide, silicon nitride, and so on), an ABF, or other suitable electrical insulating materials. Nonetheless, the disclosure is not limited thereto.

In some embodiments not shown, the first conductive connector 112 may be formed by sequentially stacking a first seed layer, a second seed layer (whose materials include titanium/copper (Ti/Cu)), for example), and an electroplating layer (whose material includes copper, for example), but the disclosure is not limited thereto. In other embodiments, the first conductive connector 112 may include other suitable conductive materials such as silver, gold, nickel, or an alloy thereof, such as Cu, Cu/Ni/Au, Cu/Ti, Cu/Ag, or the like. For example, an adhesive layer (whose material includes titanium, for example) may be formed on a conductive pad (whose material includes copper, for example). Next, a metal layer (whose material includes silver, for example) may be formed on the adhesive layer by electroplating, sputtering, or other suitable deposition manners. The thickness of the adhesive layer may be less than the thickness of the metal layer. It should be noted that, although the first conductive connector 112 is shown in the form of a pad in the drawings, the disclosure is not limited thereto. The first conductive connector may also be in the form of a pillar.

In this embodiment, the first group of circuit structure 110 includes a bottom surface 110b close to the first temporary carrier 10, and the antenna pattern 111a and the first dielectric layer 111b may be substantially flush on the bottom surface 110b. In addition, the first conductive via 111c is gradually thickened (e.g., gradually thickened in width or in diameter) in a direction toward the first conductive connector 112. In other words, the first conductive via 111c tapers (e.g., tapers in width or in diameter) in a direction toward the first temporary carrier Nonetheless, the disclosure is not limited thereto.

In some embodiments, a planarization process on the first conductive connector 112 may be omitted, but the disclosure is not limited thereto.

With reference to FIG. 1B, a second group of circuit structure 120 is formed on a second temporary carrier 20. The second group of circuit structure 120 includes a plurality of second circuit layers 121 (three second circuit layers schematically shown in FIG. 1B) and a plurality of second conductive connectors 122. Each second circuit layer 121 may include a conductive pattern 121a, a second dielectric layer 121b, and/or a second conductive via 121c. Here, the conductive pattern 121a and the second conductive via 121c may be embedded in the second dielectric layer 121b, but the disclosure is not limited thereto.

In this embodiment, the second group of circuit structure 120 includes a bottom surface 120b close to the second temporary carrier 20. The conductive pattern 121a and the second dielectric layer 121b may be substantially flush on the bottom surface 120b. In addition, the second conductive via 121c is gradually thickened (e.g., gradually thickened in width or in diameter) in a direction toward the second conductive connectors 122. In other words, the second conductive via 121c tapers (e.g., tapers in width or in diameter) in a direction toward the second temporary carrier 20. Nonetheless, the disclosure is not limited thereto.

It should be noted that, density of the conductive patterns 121a of the second circuit layers 121 close to the second conductive connectors 122 and density of the conductive patterns 121a of the second circuit layers 121 away from the second conductive connectors 122 may have a density distribution designed depending on the actual design requirements, which is not limited by the disclosure.

In addition, the materials of the conductive pattern 121a and/or the second conductive via 121c are similar to those of the antenna pattern 111a and/or the first conductive via 111c, the material of the first conductive connector 112 is similar to that of the second conductive connector 122, but the material of the second dielectric layer 121b is different from that of the first dielectric layer 111b. For example, the material of the second dielectric layer 121b may be an ABF, polypropylene (PP), or the like.

With reference to FIG. 1C, the structure as shown in FIG. 1A is flipped upside down, and the first group of circuit structure 110 and the second group of circuit structure 120 are joined by a plurality of joints 130. The joints 130 connect the first conductive connectors 112 and the second conductive connectors 122 to electrically connect the first group of circuit structure 110 to the second group of circuit structure 120 to form a multi-layer redistribution structure RDL. Here, the joints 130 may be solder joints. In addition, an underfill 101 may be optionally disposed between the first group of circuit structure 110 and the second group of circuit structure 120. The underfill 101 may be filled in the gap between the first conductive connectors 112 and the second conductive connectors 122, and the gap may be filled up. Accordingly, the underfill 101 may surround the first conductive connectors 112, the second conductive connectors 122, and the joints 130 to further improve joining reliability, but the disclosure is not limited thereto. Through the above manufacturing, a millimeter-wave antenna module package structure 100 of this embodiment has been substantially completed.

In this embodiment, the millimeter-wave antenna module package structure 100 includes the first group of circuit structure 110 and the second group of circuit structure 120. The first group of circuit structure 110 includes the at least one first circuit layer 111 (including the antenna pattern 111a) and the first conductive connectors 112. The second group of circuit structure 120 includes the second circuit layers 121 and the conductive connectors 122. The joints 130 are disposed between the first group of circuit structure 110 and the second group of circuit structure 120. The joints 130 connect the conductive connectors 112 and the second conductive connectors 122 to electrically connect the first group of circuit structure 110 to the second group of circuit structure 120 to form the multi-layer redistribution structure RDL. Accordingly, in this embodiment, a plurality of circuit structures (the first group of circuit structure 110 and the second group of circuit structure 120) are first separately and individually manufactured on the temporary carriers (the first temporary carrier 10 and the second temporary carrier 20), and then the groups of circuit structures are directly joined and assembled into a multi-layer redistribution structure (the multi-layer redistribution structure RDL). As such, compared to continuously manufacturing a multi-layer redistribution structure at one single time, warpage may be effectively reduced, and the distance between the antenna and the IC may be controlled more precisely. Accordingly, in the millimeter-wave antenna module package structure 100 of the embodiment, a relatively high efficiency of a high-frequency antenna may be achieved while the multi-layer redistribution structure RDL is provided.

Further, due to limitation of the process, the difficulty may be positively correlated with the number of layers manufactured. Accordingly, as the number of layers to be manufactured increases, the likelihood of damaging the redistribution structure as a whole during the process increases, making it unlikely to effectively control the yields and costs. In this embodiment, since the multi-layer redistribution structure RDL is divided into a plurality of groups of circuit structures with relatively few layers to be manufactured separately and individually, it is possible to avoid the unlikely effective control of the yields and costs in continuous stacking of multiple layers, but the disclosure is not limited thereto.

In some embodiments, as the line-spacing (L/S) (e.g., the line width) of the circuits is increasing fine, requirements of the process may be increasing stringent, and it may accordingly be increasingly unlikely when a multi-layer redistribution structure is to be formed. In this embodiment, by joining and assembling groups of circuit structures to manufacture fine line-spacing structures, higher yields and electrical performance may be achieved compared to continuously formed structures. For example, the first group of circuit structure 110 may have fine line-spacing less than at least 7 micrometers (μm), and the second group of circuit structure 120 may have thick line-spacing greater than at least 7 μm. In other words, in this embodiment, the multi-layer redistribution structure RDL may be a combination of a thick line-spacing circuit structure and a fine line-spacing circuit structure, but the disclosure is not limited thereto.

In some embodiments, the first conductive via 111c is gradually thickened (e.g., gradually thickened in width or in diameter) in a direction toward the first conductive connector 112, and the second conductive via 121c is gradually thickened (e.g., gradually thickened in width or in diameter) in a direction toward the second conductive connector 122. In other words, the first conductive via 111c tapers (e.g., tapers in width or in diameter) in a direction toward the first temporary carrier 10, and the second conductive via 121c tapers (e.g., tapers in width or in diameter) in a direction toward the second temporary carrier 20. In other words, after the joining process, a direction in which the first conductive via 111c tapers is opposite to a direction in which the second conductive via 121c tapers.

It should be noted that, depending on the actual application requirements, the first temporary carrier 10 and/or the second temporary carrier 20 may optionally be removed to expose the antenna pattern 111a and/or the second conductive via 121c for electrical connection with other elements. Here, the release layers may be peeled off by applying external energy between the bottom surfaces of the circuit structures and the temporary carriers.

In addition, the specific numbers of layers and groups of the first group of circuit structure 110 and the second group of circuit structure 120 may also be adjusted depending on the actual design requirements, which is not limited by the disclosure. For example, the number of the first circuit layers 111 of the first group of circuit structure 110 and the number of the second circuit layers 121 of the second group of circuit structure 120 may be the same or different. For example, FIG. 1C shows an embodiment where the number of the first circuit layer 111 (one first circuit layer) of the first group of circuit structure 110 is different from that of the second circuit layers 121 (three second circuit layers) of the second group of circuit structure 120. Moreover, the multi-layer redistribution structure RDL may also include more groups of other circuit structures similar to the first group of circuit structure 110 and/or the second group of circuit structure 120.

It should be noted here that the reference numerals and part of the content of the embodiments above remain to be used in the embodiments below, where the same or like reference numerals are used to refer to the same or like elements, and description of the same technical content is omitted. Reference may be made to the embodiments above for the description of the omitted part, which will not be repeated in the embodiments below.

FIG. 1D is a schematic partial cross-sectional view showing an alternative embodiment of FIG. 1C. With reference to FIG. 1D, a millimeter-wave antenna module package structure 100A of FIG. 1D is different from the millimeter-wave antenna module package structure 100 of FIG. 1C in the following: joints 130A of the millimeter-wave antenna module package structure 100A are in a form different from the joints 130 of the millimeter-wave antenna module package structure 100, and part of the gap between the joints 130A, the first group of circuit structure 110, and the second group of circuit structure 120 of a multi-layer redistribution structure RDL1 is not filled with the underfill 101, such that a cavity C surrounded by the underfill 101 is formed between the first group of circuit structure 110 and the second group of circuit structure 120. Further, the joints 130A may have a composite structure, for example, taking a copper ball 131 (which may also be a copper pillar in an alternative embodiment) as the core with a solder layer 132 formed outside the copper ball 131 to cover the copper ball 131. In addition, the joints 130A may be located in the cavity C and separated from the underfill 101. In other words, the joints 130A may not be in contact with the underfill 101.

In some embodiments, a height H of the gap between the first group of circuit structure 110 and the second group of circuit structure 120 may affect the size of device, the process technology, the antenna performance, and the device applicability, among others. The joints 130A having a composite structure may be configured to control the height H of the gap between the first group of circuit structure 110 and the second group of circuit structure 120. Accordingly, the electrical performance of the millimeter-wave antenna module package structure 100A may be further improved. Nonetheless, the disclosure is not limited thereto.

In some embodiments, the cavity C may be an air cavity, and may be additionally filled with other dielectric materials based on applications of the antenna, which is not limited by the disclosure.

Figure 2A:
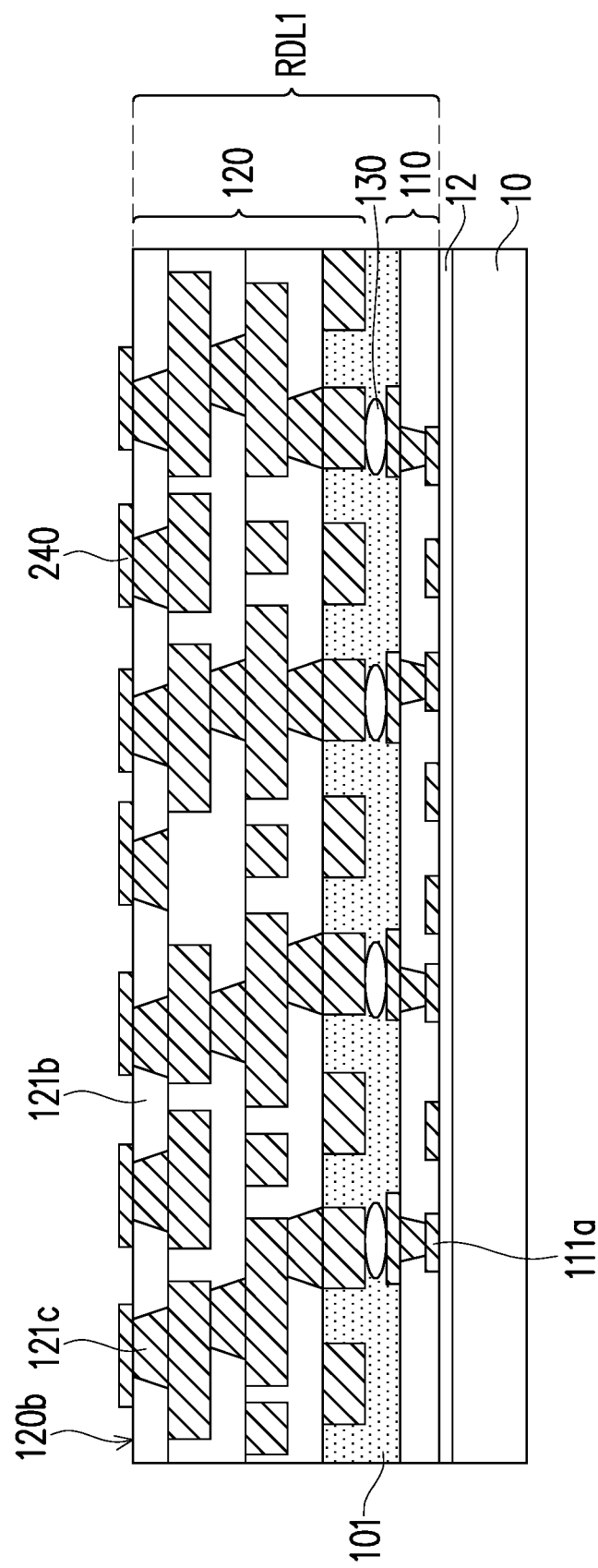
FIG. 2A to FIG. 2C are schematic partial cross-sectional views showing a manufacturing method of a millimeter-wave antenna module package structure according to some embodiments of the disclosure.
Figure 2B:
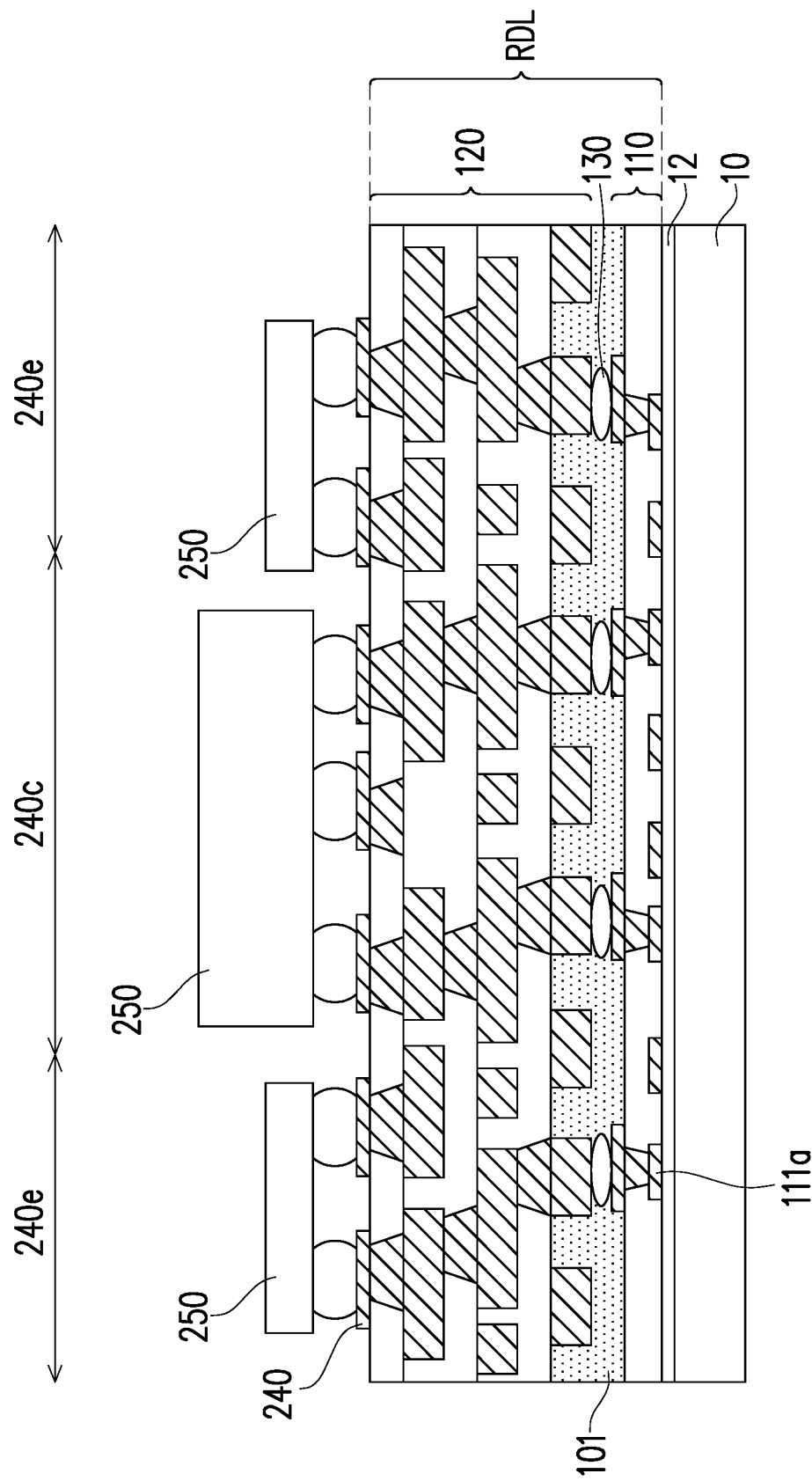
Figure 2C:
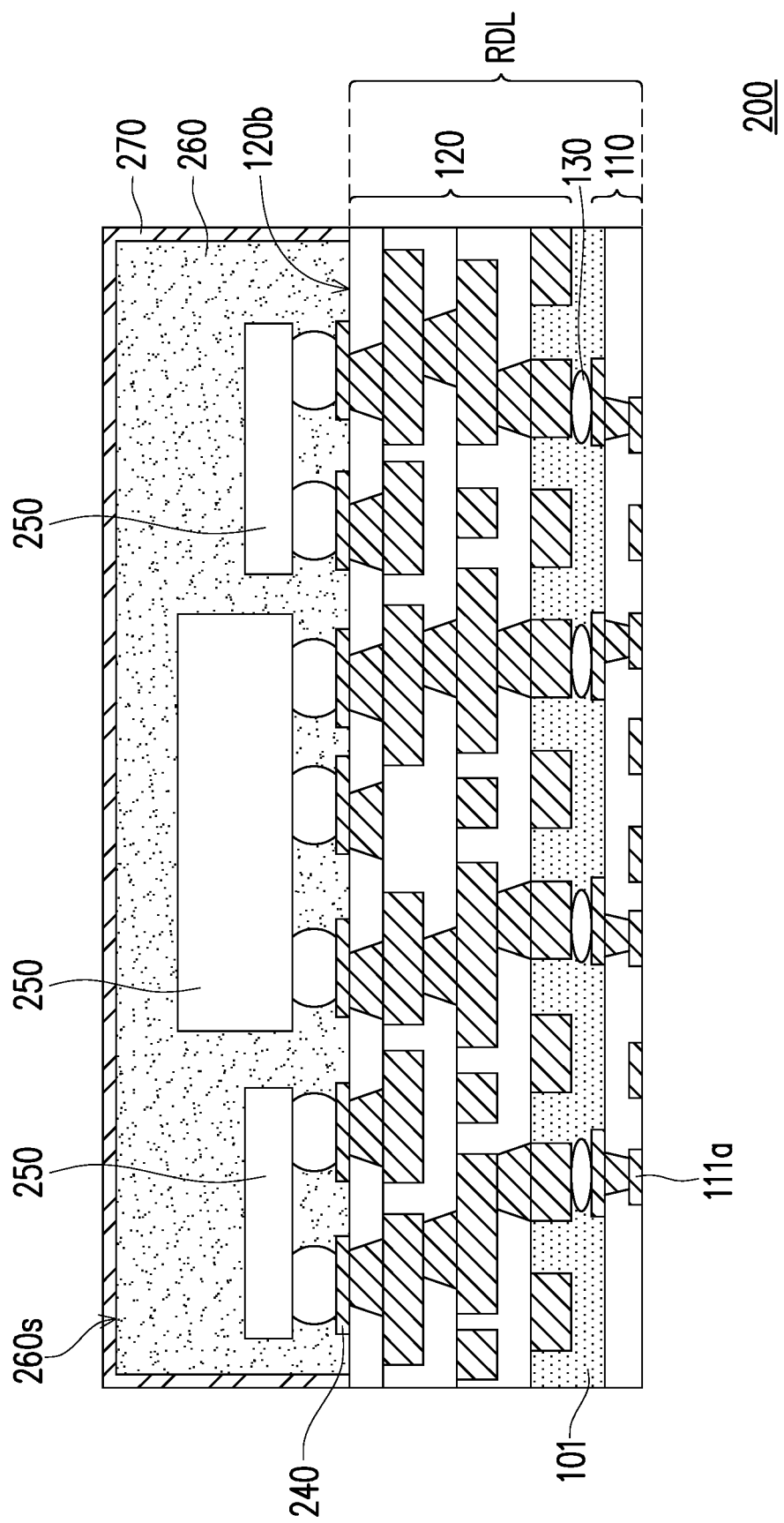

FIG. 2A to FIG. 2C are schematic partial cross-sectional views showing a manufacturing method of a millimeter-wave antenna module package structure according to some embodiments of the disclosure. With reference to FIG. 2A, following FIG. 1C, a second release layer 22 and the second temporary carrier 20 are removed to expose the second conductive via 121c and the second dielectric layer 121b on the bottom surface 120b of the second group of circuit structure 120. Next, a plurality of pads 240 are formed on the second conductive via 121c on the bottom surface 120b of the second group of circuit structure 120. Here, the pad 240 may be formed using any suitable conductive material in any manner.

With reference to FIG. 2B, a plurality of first semiconductor devices 250 are disposed on the pads 240 of the second group of circuit structure 120, and the first semiconductor devices 250 are electrically connected to the second group of circuit structure 120. In addition, the first semiconductor devices 250 may be electrically connected to the antenna pattern 111a of the first group of circuit structure 110 by the second group of circuit structure 120.

In some embodiments, the pads 240 may be distributed with a central region 240c and peripheral regions 240e located on both sides of the central region. The first semiconductor devices 250 disposed in the central region 240c may be RF chips (one schematically shown) and the first semiconductor devices 250 disposed in the peripheral regions 240e may be passive elements (two schematically shown). In other words, the passive elements may be located on both sides of the RF chip. Nonetheless, the disclosure is not limited thereto. The number, type, and arrangement position of the first semiconductor devices 250 may be adjusted depending on the actual design requirements.

With reference to FIG. 2C, an encapsulant 260 is formed on the bottom surface 120b of the second group of circuit structure 120 to encapsulate the first semiconductor devices 250. The encapsulant 260 may be a molding compound formed by a molding process. Here, the encapsulant 260 may be formed of an insulating material such as epoxy resin or other suitable resin, but the disclosure is not limited thereto. Next, a cladding layer 270 may be formed on the encapsulant 260, such that a millimeter-wave antenna module package structure 200 may have relatively good electromagnetic interference (EMI) shielding. The cladding layer 270 may be conformally formed on the outer surface 260s of the encapsulant 260. Then, the first release layer 12 and the first temporary carrier 10 are removed to complete the millimeter-wave antenna module package structure 200 of this embodiment. Here, the manufacturing process of the cladding layer 270 may include performing a physical vapor deposition or electroplating process, and the material may include copper, tin, aluminum, steel, or other suitable materials.

In some embodiments, the millimeter-wave antenna module package structure 200 of FIG. 2C is Antenna-in-Package (AiP), but the disclosure is not limited thereto.

Figure 3A:
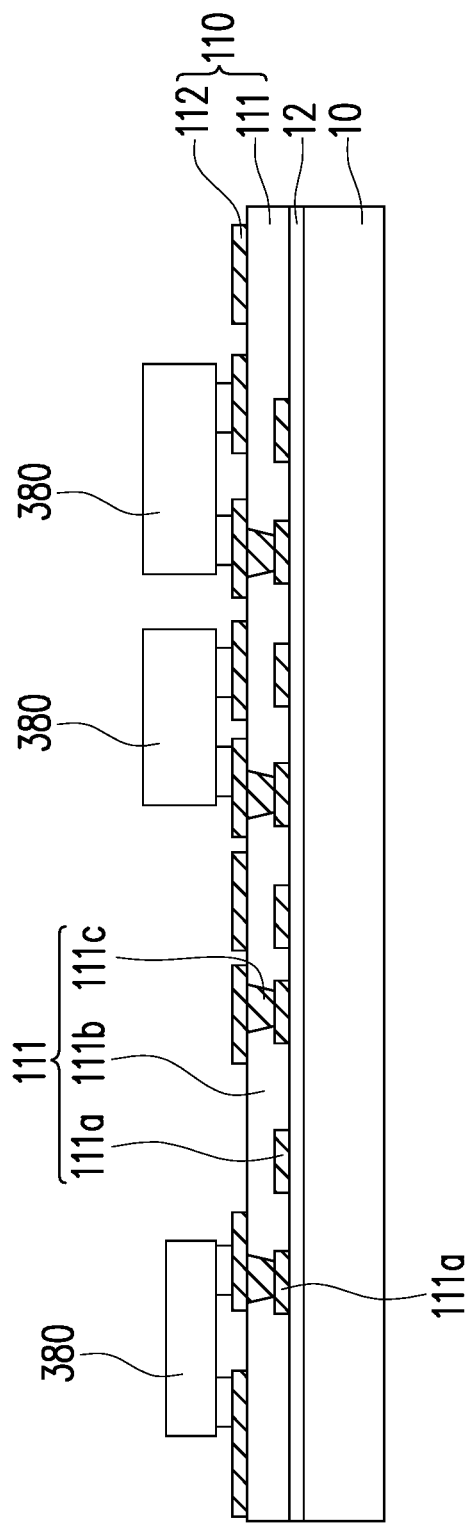
FIG. 3A to FIG. 3E are schematic partial cross-sectional views showing a manufacturing method of a millimeter-wave antenna module package structure according to some embodiments of the disclosure.

FIG. 3A to FIG. 3E are schematic partial cross-sectional views showing a manufacturing method of a millimeter-wave antenna module package structure according to some embodiments of the disclosure. FIG. 3F and FIG. 3G are schematic partial cross-sectional views showing alternative embodiments of FIG. 3B. With reference to FIG. 3A, the first group of circuit structure 110 that is similar to FIG. 1A is provided, while a plurality of second semiconductor devices 380 are further disposed thereon. Here, the second semiconductor devices 380 include an inductor, a capacitor, or the like, for example. Moreover, the number and arrangement positions as shown in FIG. 3A are only exemplary, and the number, type, and arrangement position of the second semiconductor devices 380 may be selected depending on the actual design requirements.

Figure 3B:
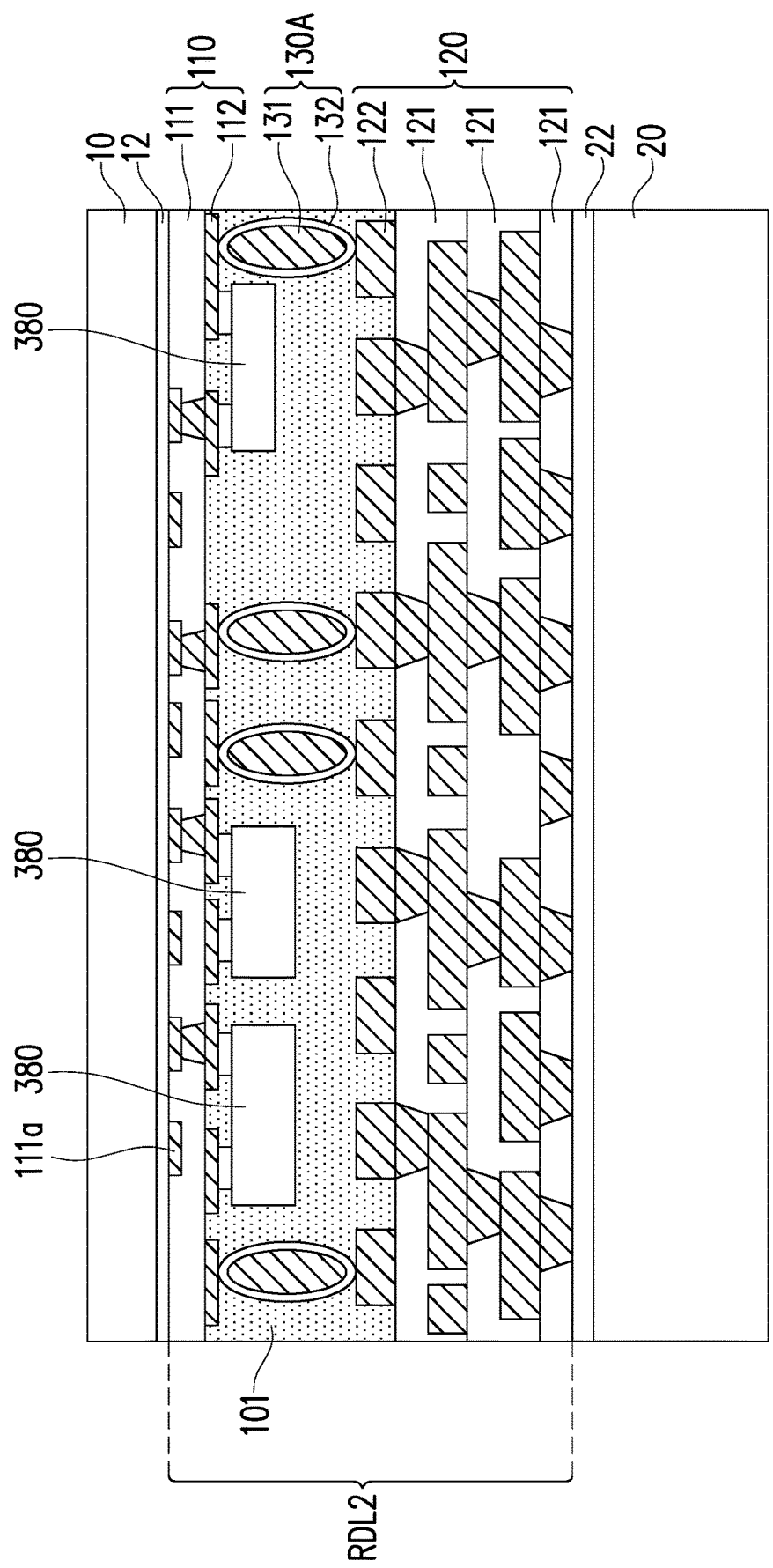

With reference to FIG. 3B, the second group of circuit structure 120 of FIG. 1B is provided, and the first group of circuit structure 110 and the second group of circuit structure 120 are joined by the joints 130A as shown in FIG. 1D (the joints 130 as shown in FIG. 1C may also be used in an alternative embodiment), such that there is a sufficient height between the first group of circuit structure 110 and the second group of circuit structure 120 to form a gap, so as to accommodate the second semiconductor devices 380 on the first group of circuit structure 110. In other words, the second semiconductor devices 380 may be disposed between the first group of circuit structure 110 and the second group of circuit structure 120. Here, the semiconductor devices 380 may be joined on the first group of circuit structure 110 in a suitable manner, which is not limited by the disclosure. In addition, the first group of circuit structure 110, the joints 130A, the second group of circuit structure 120, the underfill 101, and the second semiconductor devices 380 may form a multi-layer redistribution structure RDL2.

In addition, in this embodiment, the underfill 101 may be filled in the gap between the first conductive connectors 112 and the second conductive connectors 122, and the gap may be filled up. Accordingly, the underfill 101 may surround the first conductive connectors 112, the second conductive connectors 122, the joints 130A, and the second semiconductor devices 380 to further improve joining reliability, but the disclosure is not limited thereto.

Comparatively, in some alternative embodiments, the joints 130A may also have other different aspects. For example, as shown in FIG. 3F, the first group of circuit structure 110 and the second group of circuit structure 120 are joined by joints 140. The joints 140 may include a copper pillar 141 and a solder bump 142. Further, in the embodiment of FIG. 3F, the copper pillar 141 may be in direct contact with the second group of circuit structure 120, and the solder bump 142 may be in direct contact with the first group of circuit structure 110, but the disclosure is not limited thereto. In another alternative embodiment, as shown in FIG. 3G, the copper pillar 141 may be in direct contact with the first group of circuit structure 110, and the solder bump 142 may be in direct contact with the second group of circuit structure 120.

Figure 3C:
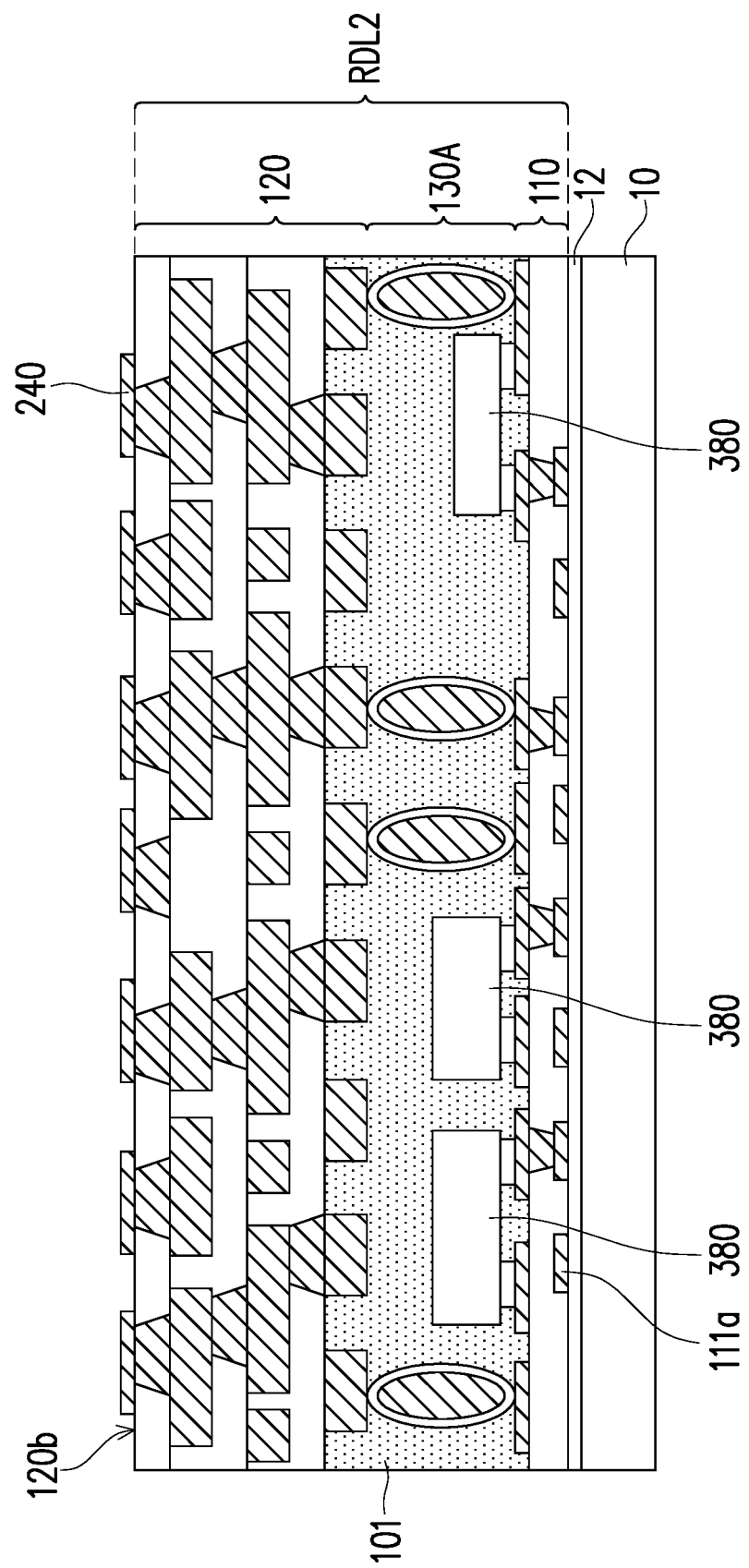

With reference to FIG. 3C, similar to FIG. 2A, the second release layer 22 and the second temporary carrier 20 are removed to expose the second conductive via 121c and the second dielectric layer 121b on the bottom surface 120b of the second group of circuit structure 120. Next, the pads 240 are formed on the second conductive via 121c on the bottom surface 120b of the second group of circuit structure 120.

Figure 3D:
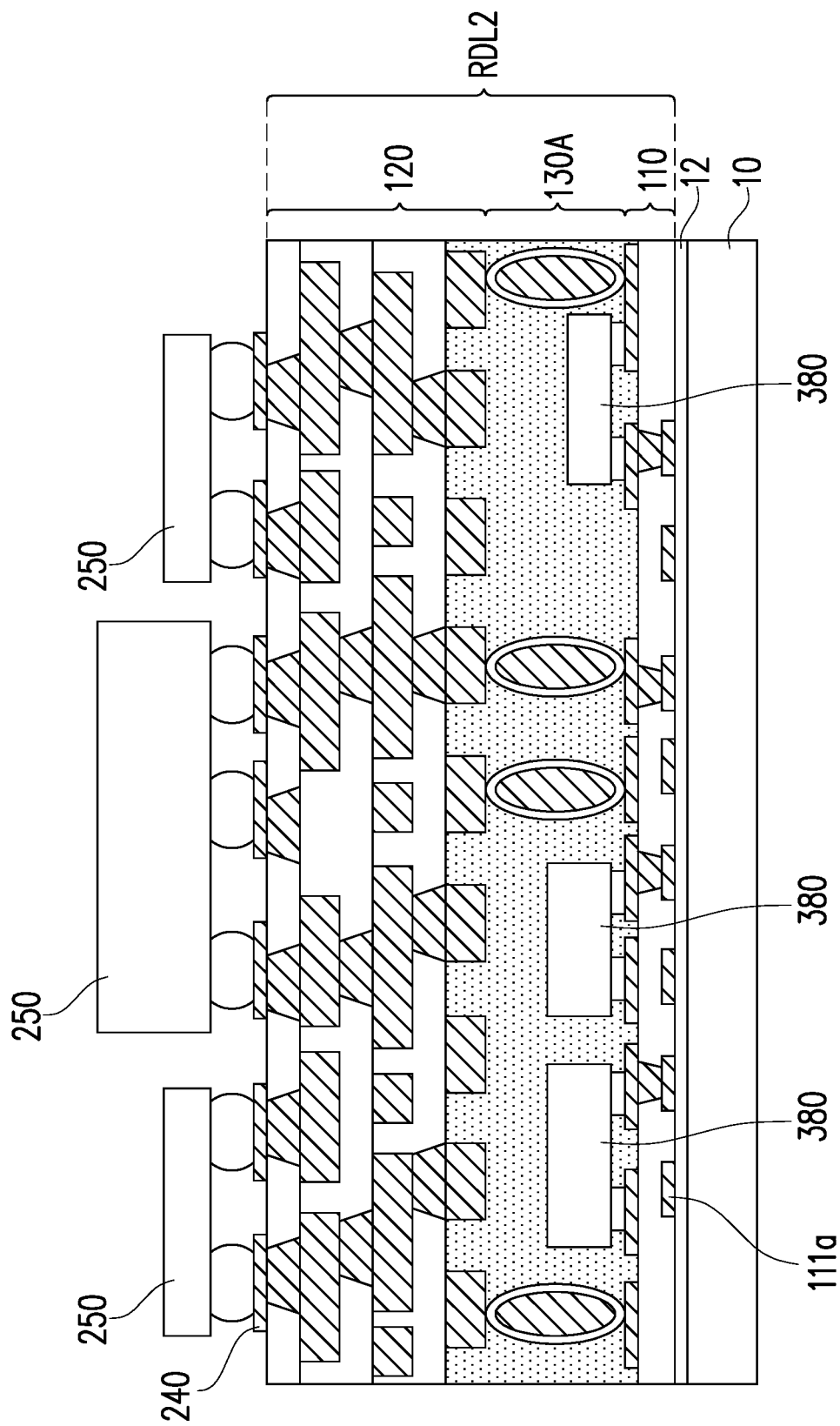

With reference to FIG. 3D, similar to FIG. 2B, the first semiconductor devices 250 are disposed on the pads 240 of the second group of circuit structure 120, and the first semiconductor devices 250 are electrically connected to the second group of circuit structure 120. The first semiconductor devices 250 may be electrically connected to the antenna pattern 111a of the first group of circuit structure 110 by the second group of circuit structure 120.

Figure 3E:
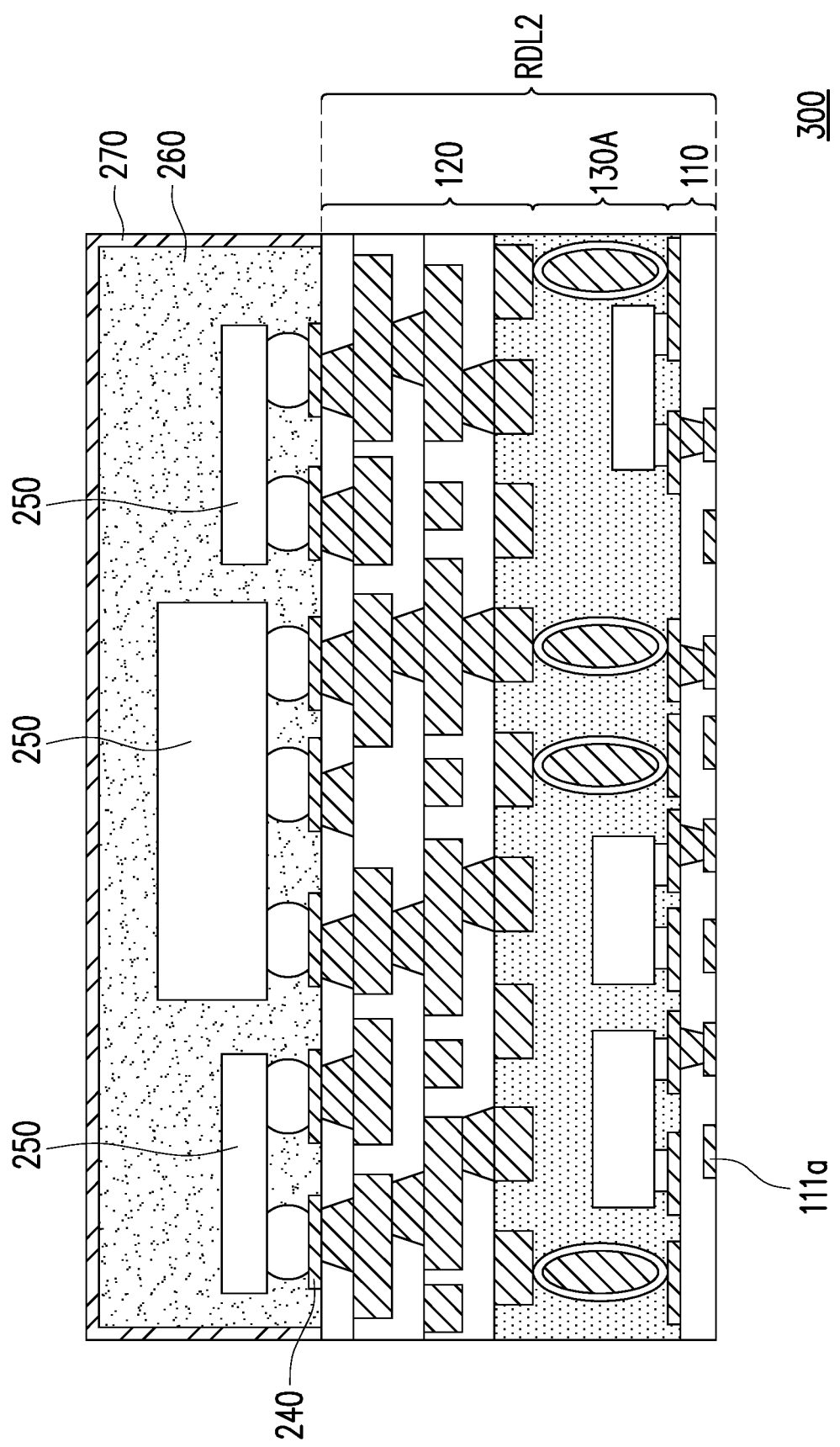
Figure 3F:
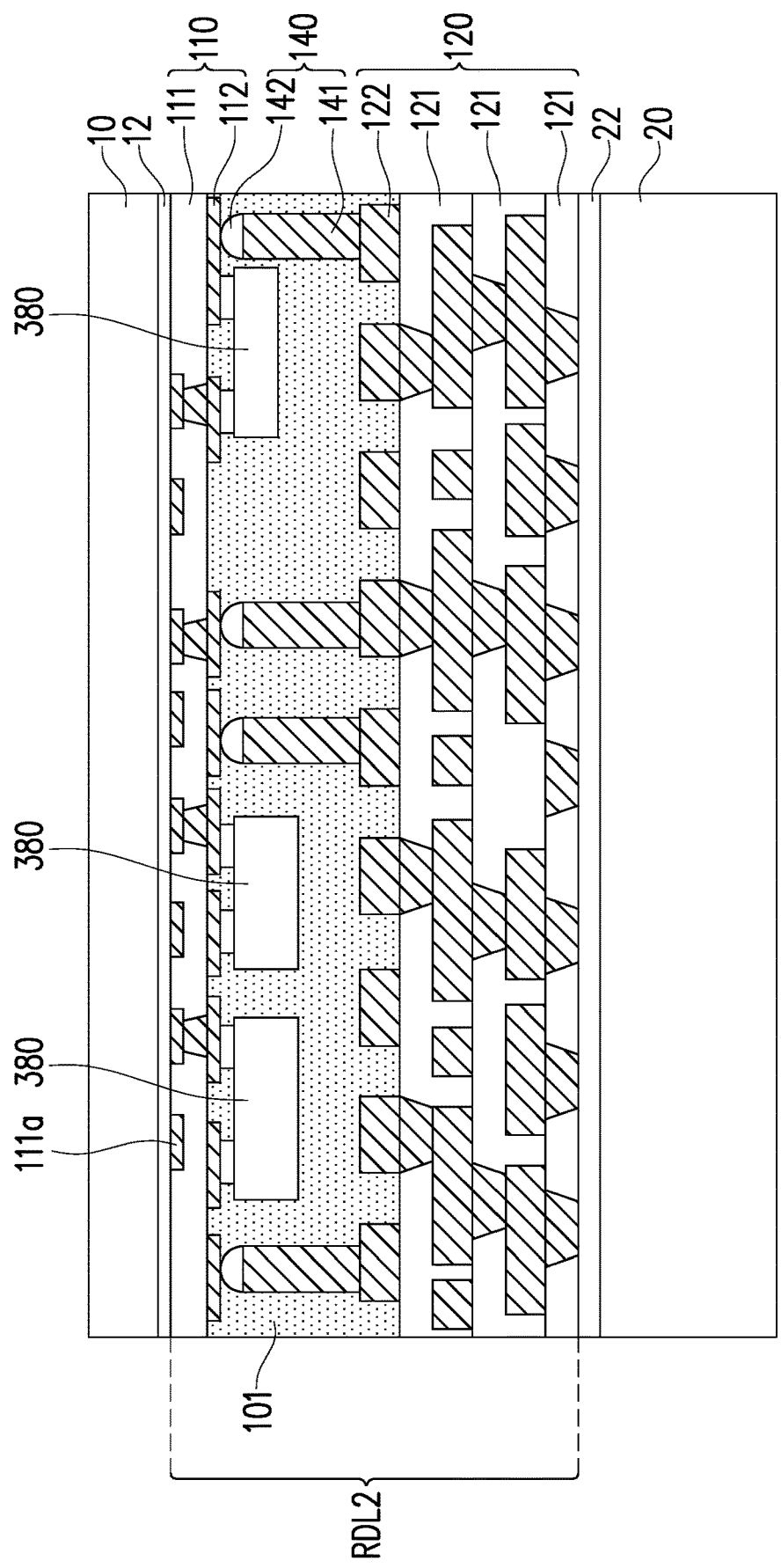
FIG. 3F and FIG. 3G are schematic partial cross-sectional views showing millimeter-wave antenna module package structures according to some embodiments of the disclosure.
Figure 3G:
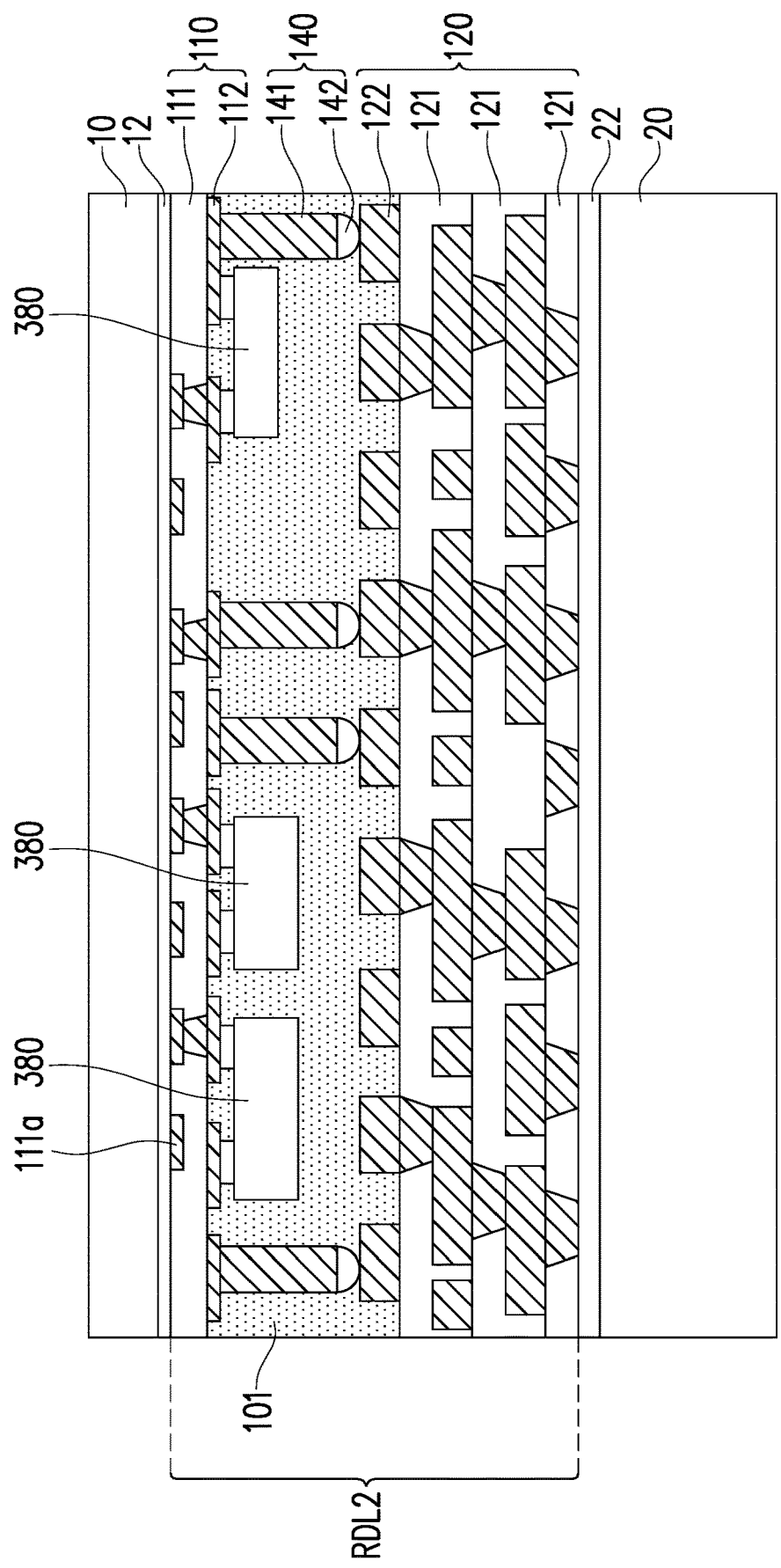

With reference to FIG. 3E, similar to FIG. 2C, the encapsulant 260 is formed on the bottom surface 120b of the second group of circuit structure 120 to encapsulate the first semiconductor devices 250, and the cladding layer 270 is formed on the encapsulant 260, such that the millimeter-wave antenna module package structure 200 may have relatively good EMI shielding. Then, the first release layer 12 and the first temporary carrier 10 are removed to complete a millimeter-wave antenna module package structure 300 of this embodiment.

In some embodiments, the millimeter-wave antenna module package structure 300 of FIG. 3E is Antenna-in-Package (AiP), but the disclosure is not limited thereto.

Figure 4A:
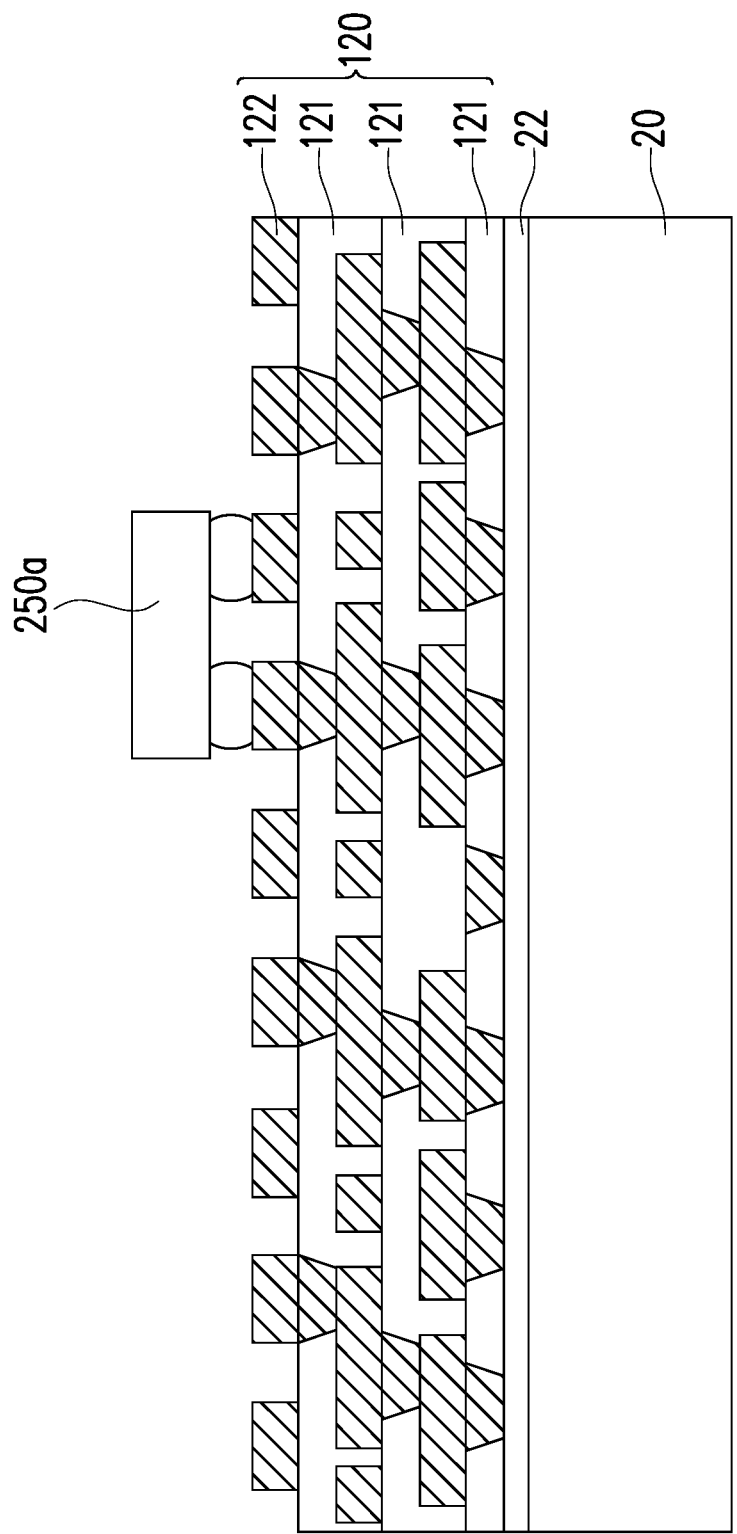
FIG. 4A and FIG. 4C are schematic partial cross-sectional views showing alternative embodiments of FIG. 1B.
Figure 4B:
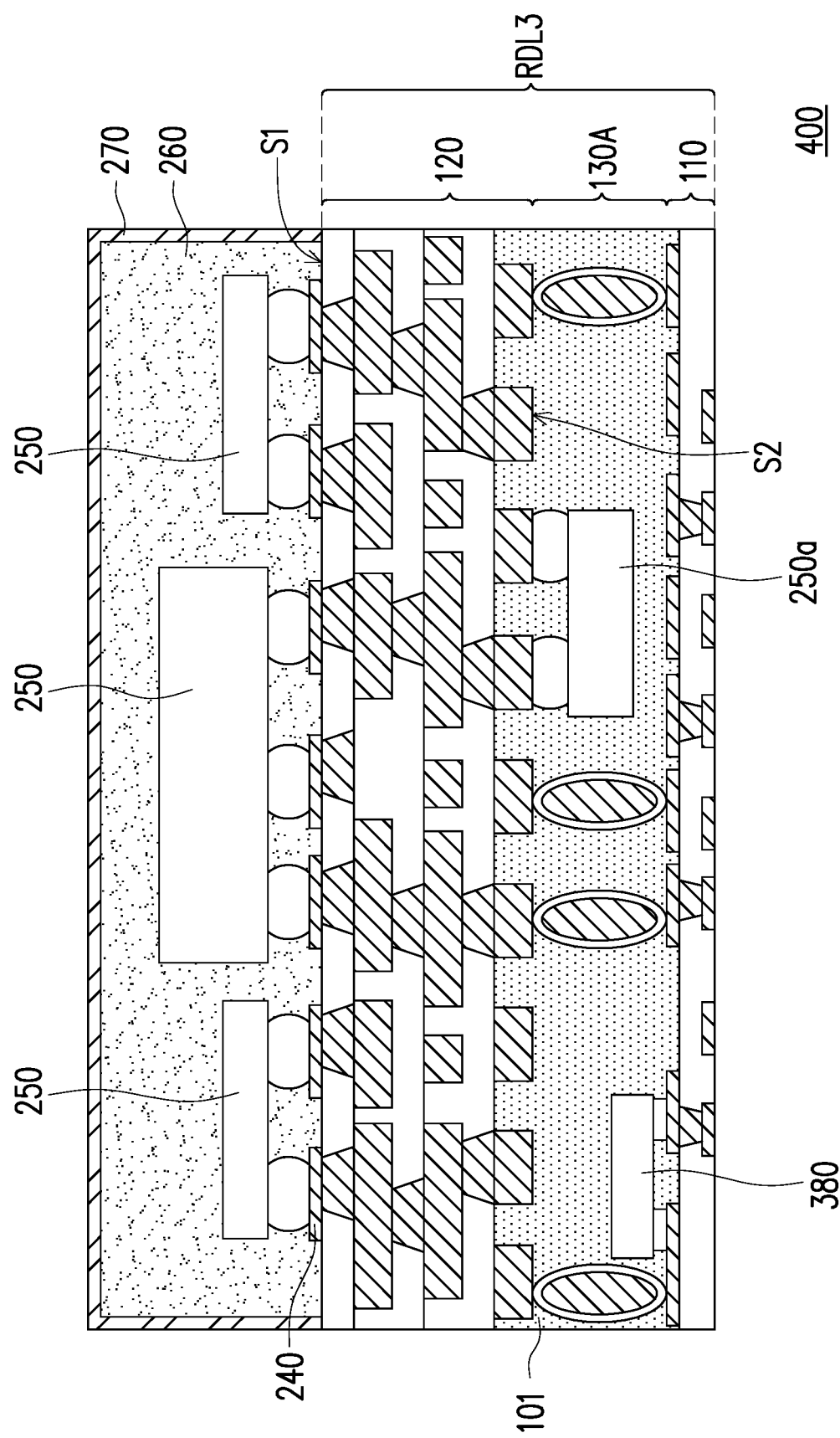
FIG. 4B is a schematic partial cross-sectional view of a millimeter-wave antenna module package structure formed by the circuit structure of FIG. 4A.
Figure 4C:
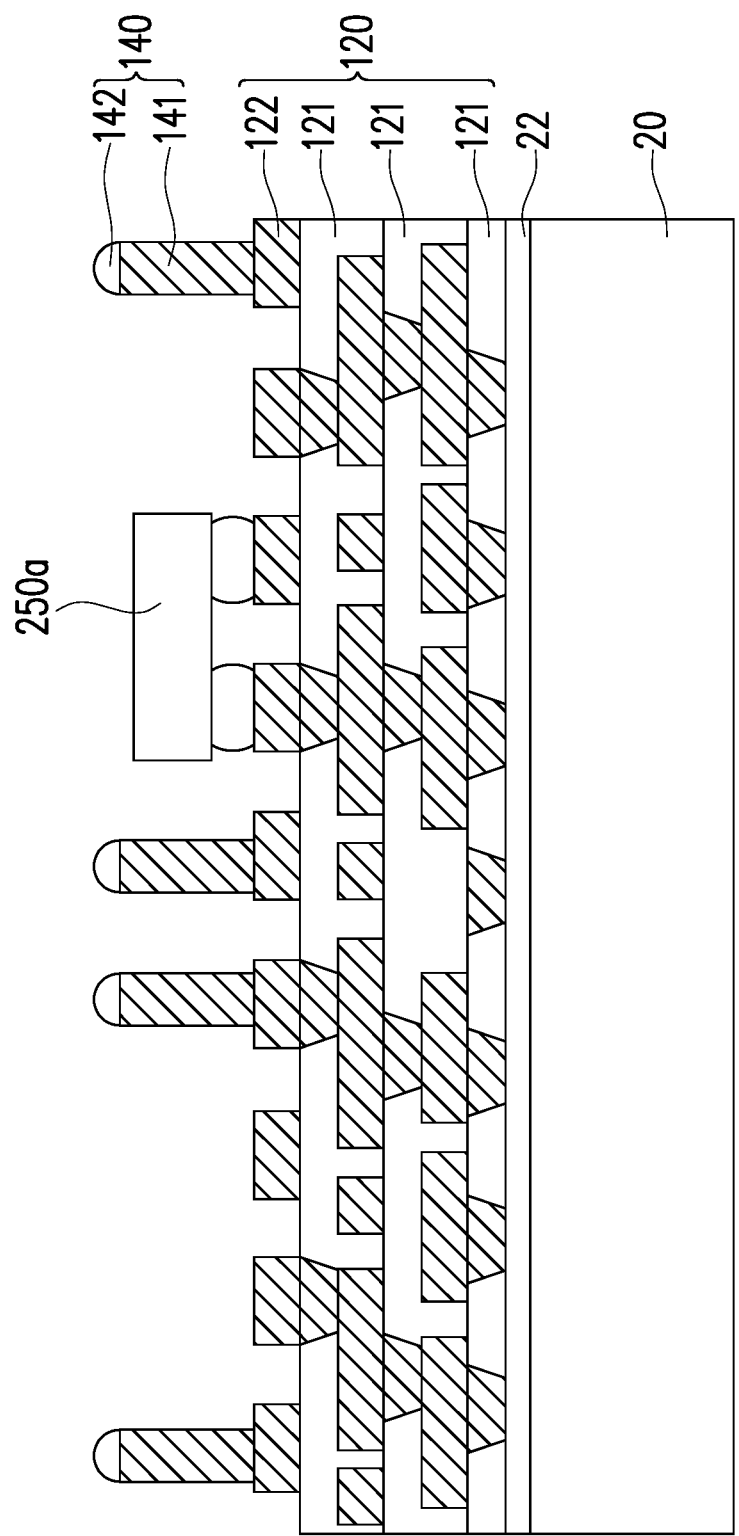

FIG. 4A is a schematic partial cross-sectional view showing an alternative embodiment of FIG. 1B. FIG. 4B is a schematic partial cross-sectional view of a millimeter-wave antenna module package structure formed by the circuit structure of FIG. 4A. FIG. 4C is a schematic partial cross-sectional view showing an alternative embodiment of FIG. 1B. With reference to FIG. 4A, the second group of circuit structure 120 that is similar to FIG. 1B is provided, while another first semiconductor device 250a is further disposed thereon. Here, the first semiconductor device 250a may be an RF chip. In addition, in an alternative embodiment, as shown in FIG. 4C, the joints 140 may further be provided, which includes the copper pillar 141 and the solder bump 142, and are disposed on the second group of circuit structure 120 and located on both sides of the first semiconductor device 250a. Nonetheless, the disclosure is not limited thereto.

Next, with reference to FIG. 4B, the first group of circuit structure 110 similar to FIG. 3A is provided (while one second semiconductor device 380 is disposed). The first group of circuit structure 110 and the second group of circuit structure 120 are joined by the joints 130A as shown in FIG.

1D (the joints 130 as shown in FIG. 1C may also be used in an alternative embodiment). The first group of circuit structure 110, the joints 130A, the second group of circuit structure 120, the underfill 101, the first semiconductor device 250a, and the second semiconductor device 380 may form a multi-layer redistribution structure RDL3. Then, a millimeter-wave antenna module package structure 400 of this embodiment is completed by steps similar to FIG. 3C to FIG. 3E. Further, in this embodiment, a part of the first semiconductor devices (i.e., the first semiconductor device 250) is disposed on a surface S1 of the second group of circuit structure, and another part of the first semiconductor devices (i.e., first semiconductor device 250a) is disposed on another surface S2 of the second group of circuit structure 120 opposite to the surface S1. Moreover, since the first semiconductor device 250a may be an RF chip, the first semiconductor device 250 disposed in the central region 240c on the surface S1 of the second group of circuit structure may be other IC chips. In addition, since the first semiconductor device 250a (e.g., an RF chip) is disposed in the gap between the first group of circuit structure 110 and the second group of circuit structure 120, the first device 250a (e.g., an RF chip) may be embedded in the underfill 101, but the disclosure is not limited thereto.

It should be noted that the multi-layer redistribution structure in the millimeter-wave antenna module package structure may also be replaced with the multi-layer redistribution structure RDL1 (having the cavity C) in FIG. 1D. In addition, the first group of circuit structure 110 may also be replaced with a circuit structure having thick line-spacing greater than at least 7 μm and having an antenna pattern, and the second group of circuit structure 120 may also be replaced with a circuit structure having fine line-spacing less than at least 7 μm.

In summary of the foregoing, in an embodiment of the disclosure, a plurality of groups of circuit structures are first separately and individually manufactured on the temporary carriers, and then the groups of circuit structures are directly joined and assembled into a multi-layer redistribution structure. As such, compared to continuously manufacturing a multi-layer redistribution structure at one single time, warpage may be effectively reduced, and the distance between the antenna and the IC may be controlled more precisely. Accordingly, in the millimeter-wave antenna module package structure in an embodiment of the disclosure, a relatively high efficiency of a high-frequency antenna may be achieved while the multi-layer redistribution structure is provided.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A millimeter-wave antenna module package structure comprising:
    a first group of circuit structure comprising at least one first circuit layer and a plurality of first conductive connectors, wherein the at least one first circuit layer comprises an antenna pattern;
    a second group of circuit structure comprising a plurality of second circuit layers and a plurality of second conductive connectors, wherein each of the at least one first circuit layer comprises a plurality of first conductive vias, each of the second circuit layers comprises a plurality of second conductive vias, and a direction in which the first conductive vias taper is opposite to a direction in which the second conductive vias taper; and
    a plurality of joints disposed between the first group of circuit structure and the second group of circuit structure, wherein the joints connect the first conductive connectors and the second conductive connectors to electrically connect the first group of circuit structure to the second group of circuit structure to form a multi-layer redistribution structure.

2. The millimeter-wave antenna module package structure according to claim 1, further comprising an underfill filling at least part of a gap between the joints, the first group of circuit structure, and the second group of circuit structure.

3. The millimeter-wave antenna module package structure according to claim 2, wherein part of the gap is not filled by the underfill, such that a cavity surrounded by the underfill is formed between the first group of circuit structure and the second group of circuit structure.

4. The millimeter-wave antenna module package structure according to claim 3, wherein the joints are located in the cavity and separated from the underfill.

5. The millimeter-wave antenna module package structure according to claim 2, wherein the gap is filled up.

6. The millimeter-wave antenna module package structure according to claim 1, further comprising:
    a first semiconductor device disposed on the second group of circuit structure and electrically connected to the second group of circuit structure.

7. The millimeter-wave antenna module package structure according to claim 6, wherein the first semiconductor device comprises a plurality of first semiconductor devices, a part of the first semiconductor devices is disposed on a surface of the second group of circuit structure, and another part of the first semiconductor devices is disposed on another surface of the second group of circuit structure opposite to the surface.

8. The millimeter-wave antenna module package structure according to claim 6, further comprising:
    a second semiconductor device disposed on the first group of circuit structure and electrically connected to the first group of circuit structure.

\* \* \* \* \*